United States Patent [19]

Chou

[11] Patent Number: 5,772,905

[45] Date of Patent: Jun. 30, 1998

[54] NANOIMPRINT LITHOGRAPHY

[75] Inventor: Stephen Y. Chou, Golden Valley, Minn.

[73] Assignee: Regents of the University of Minnesota, Minneapolis, Minn.

[21] Appl. No.: 558,809

[22] Filed: Nov. 15, 1995

[51] Int. Cl.[6] .................................................. H01L 21/304
[52] U.S. Cl. ............................... 216/44; 216/52; 216/53; 438/691; 438/700; 438/735
[58] Field of Search ................................. 216/11, 40, 44, 216/52, 53, 58, 83; 438/691, 700, 735

[56] References Cited

U.S. PATENT DOCUMENTS

| | | | |
|---|---|---|---|
| 3,743,842 | 7/1973 | Smith et al. | 250/320 |
| 4,310,743 | 1/1982 | Seliger | 219/121 |
| 4,325,779 | 4/1982 | Rossetti | 216/44 |
| 4,383,026 | 5/1983 | Hall | 430/325 |
| 4,450,358 | 5/1984 | Reynolds | 250/492.1 |
| 4,498,009 | 2/1985 | Reynolds | 250/452.1 |
| 4,516,253 | 5/1985 | Novak | 378/34 |
| 4,552,615 | 11/1985 | Amendola et al. | 216/44 |
| 4,576,678 | 3/1986 | Shibata | 216/40 |
| 4,606,788 | 8/1986 | Moran | 216/40 |
| 4,731,155 | 3/1988 | Napoli et al. | 216/44 |
| 4,832,790 | 5/1989 | Rossetti | 216/44 |
| 5,277,749 | 1/1994 | Griffith et al. | 216/40 |

FOREIGN PATENT DOCUMENTS

| | | |
|---|---|---|
| 1-196749 A | 8/1989 | Japan . |
| WO 91/17565 A1 | 11/1991 | WIPO . |

OTHER PUBLICATIONS

"Moiré Alignment Technique for the Mix and Match Lithographic System," *American Vacuum Society*, by Tsutomu Nomura, Seiichiro Kimura, Yoshiyuku Uchida and Shuzo Hattori, Jan./Feb. 1988 pp. 394–398.

"An Alignment Technique Using Diffracted Moiré Signals," *American Vacuum Society*, by Kenji Hara, Yoshiiyuki Uchida, Tsutomu Nomura, Seiichiro Klmura, Dai Sugimoto, Akihiro Yoshida, Hiroshi Miyake, Takahide Lida and Shuzo Hattori, Nov./Dec. 1989, pp. 1977–1979.

"Molding of Plastic Components Using Micro–Dem Tools," *Electronics Manufacturing Technology Symposium*, by Hong Li and Stephen D. Senturia, 1992, pp. 145–149.

"10 nm Electron Beam Lithography and Sub–50 nm Overlay Using a Modified Scanning Electron Microscope," *American Institute of Physics*, by P. B. Fischer and S. Y. Chou, 1993, pp. 2989–2991. Jun. 1993.

"250–Å Linewidths and PMMA Electron Resist," *American Institute of Physics*, by A. N. Broere, J. M. E. Harper, and W. W. Moizen, 1978, pp. 392–394. Sep. 1978.

"Molding of Threedimensional Microstructures by the Liga Process," *IEEE* by M. Harmening, W. Bacher, P. Bley, A. El–Khali, H. Kalb, B. Kowanz, W. Menz, A Michel and J. Mohr, 1992, pp. 202–207. Feb. 1972.

*Primary Examiner*—R. Bruce Breneman
*Assistant Examiner*—Anita Alanko
*Attorney, Agent, or Firm*—Westman, Champlin & Kelly, P.A.

[57] ABSTRACT

A lithographic method and apparatus for creating ultra-fine (sub-25 nm) patterns in a thin film coated on a substrate is provided, in which a mold having at least one protruding feature is pressed into a thin film carried on a substrate. The protruding feature in the mold creates a recess of the thin film. The mold is removed from the film. The thin film then is processed such that the thin film in the recess is removed exposing the underlying substrate. Thus, the patterns in the mold is replaced in the thin film, completing the lithography. The patterns in the thin film will be, in subsequent processes, reproduced in the substrate or in another material which is added onto the substrate.

19 Claims, 9 Drawing Sheets

5,772,905

NANOIMPRINT LITHOGRAPHY

BACKGROUND OF THE INVENTION

The present invention relates to the lithography of the type used to produce integrated circuits and microdevices. More specifically, the present invention relates to a process that creates patterns with ultra fine features in a thin film carried on a surface of a substrate.

In fabrication of semiconductor integrated electrical circuits, integrated optical, magnetic, mechanical circuits and microdevices, and the like, one of the key processing methods is the lithography. Lithography creates a pattern in a thin film carried on a substrate so that, in subsequent process steps, the pattern will be replicated in the substrate or in another material which is added onto the substrate. Since the role of the thin film is to protect a part of the substrate in the subsequent replication steps, the thin film is called resist.

A typical lithography process for the integrated circuits fabrication involves exposing a resist with a beam of energetic particles which are electrons, or photons, or ions, by either passing a flood beam through a mask or scanning a focused beam. The particle beam changes the chemical structure of the exposed area of the film, so that when immersed in a developer, either the exposed area or the unexposed area of the resist will be removed to recreate the patterns or its obverse of the mask or the scanning. The lithography resolution is limited by the wavelength of the particles, the particle scattering in the resist and the substrate, and the properties of the resist.

There is an ongoing need in art of lithography to produce progressively smaller pattern size. There is a great need to develop low-cost technologies for mass producing sub-50 nm structures since such a technology could have an enormous impact in many areas of engineering and science. Not only will the future of semiconductor integrated circuits be affected, but the commercialization of many innovative electrical, optical, magnetic, mechanical microdevices that are far superior to current devices will rely on the possibility of such technology.

Numerous technologies have been developed to service this need, but they all suffer serious drawbacks and none of them can mass produce sub-50 nm lithography at a low cost. Electron beam lithography has demonstrated 10 nm lithography resolution. A. N. Broers, J. M. Harper, and W. W. Molzen, Appl. Phys. Lett. 33, 392 (1978) and P. B. Fischer and S. Y. Chou, Appl. Phys. Lett. 62, 2989 (1993). But using it for mass production of sub-50 nm structures seems economically impractical due to inherent low throughput in a serial processing tool. X-ray lithography, which can have a high throughput, has demonstrated 50 nm lithography resolution. K. Early, M. L. Schattenburg, and H. I. Smith, Microelectronic Engineering 11, 317 (1990). But the X-ray lithography tools are rather expensive and its ability for mass producing sub-50 nm structures is yet to be seen. Furthermore, lithographies based on scanning probes have produced sub-10 nm structures in a very thin layer of materials. However, the practicality of such lithographies as a manufacturing tool is hard to judge at this point.

Imprint technology using compressive molding of thermoplastic polymers is a low cost mass manufacturing technology and has been around for several decades. Features with sizes greater than 1 micrometers have been routinely imprinted in plastics. Compact disks which are based on imprinting of polycarbonate are one example. Other examples are imprinted polymethyl methacrylate (PMMA) structures with a feature size on the order to 10 micrometers for making micromechanical parts. M. Harmening, W. Bacher, P. Bley, A. El-Kholi, H. Kalb, B. Kowanz, W. Menz, A. Michel, and J. Mohr, Proceedings IEEE Micro Electro Mechanical Systems, 202 (1992). Molded polyester micromechanical parts with feature dimensions of several tens of microns have also been used. H. Li and S. D. Senturia, Proceedings of 1992 13th IEEE/CHMT International Electronic Manufacturing Technology Symposium, 145 (1992). However, no one has recognized the use of imprint technology to provide 25 nm structures with high aspect ratios. Furthermore, the possibility of developing a lithographic method that combines imprint technology and other technologies to replace the conventional lithographies used in semiconductor integrated circuit manufacturing has never been raised.

SUMMARY OF THE INVENTION

The present invention relates to a method and apparatus for performing ultra-fine line lithography of the type used to produce integrated circuits and microdevices. A layer of thin film is deposited upon a surface of a substrate. A mold having at least one protruding feature and a recess is pressed into the thin film, therefore the thickness of the film under the protruding feature is thinner than the thickness of the film under the recess and a relief is formed in the thin film. The relief generally conforms to the shape of the feature on the mold. After mold is removed from the film, the thin film is processed such that the thinner portion of the film in the relief is removed exposing the underlying substrate. Thus, the patterns in the mold is replicated in the thin film, completing the lithography. The patterns in the thin film will be, in subsequent processes, reproduced in the substrate or in another material which is added onto the substrate.

The invention described here is based on a fundamentally different principle from conventional lithographies. The invention can eliminate many resolution limitations imposed in conventional lithographies, such as wavelength limitation, backscattering of particles in the resist and substrate, and interferences. It has been demonstrated the present invention is a high throughput mass production lithography method for generating sub-25 nm features. Furthermore, the present invention has the ability to mass produce 10 nm features at a low cost. These capabilities of the present invention is unattainable with the prior art.

DETAILED DESCRIPTION OF THE PREFERRED EMBODIMENTS

This invention relates to a method and apparatus for a high-resolution, high-throughput, low-cost lithography. Unlike current microlithographies, the present invention abandons usage of energetic light or particle beams. Instead, the present invention is based on pressing a mold into a thin film on a substrate to create a relief and, later removing the compressed area of the film to expose the underlying substrate and to form a resist pattern on the substrate that replicates the obverse of the protruding pattern of the mold.

The present invention has demonstrated the generation of patterns, such as holes, pillars, or trenches in a thin film on a substrate, that have a minimum size of 25 nm, a depth over 100 nm, a side wall smoothness better than 3 nm, and corners with near perfect 90 degrees angles. It was found that presently the size of imprinted features is limited by the size of the mold being used; with a suitable mold, the present invention should create sub-10 nm structures with a high aspect ratio. Furthermore, using one embodiment of the present invention that including a material deposition and a lift-off process, 100 nm wide metal lines of a 200 nm period and 25 nm diameter metal dots of 125 nm period have been fabricated. The resist pattern created using the present invention also has been used as a mask to etch nanostructures into the substrate.

The present invention offers many unique advantages over the prior art. First, since it is based on a paradigm different from the prior art and it abandons the usage of an energetic particle beam such as photons, electrons, and ions, the present invention eliminates many factors that limit the resolution of conventional lithographies, such as wave diffraction limits due to a finite wavelength, the limits due to scattering of particles in the resist and the substrate, and interferences. Therefore the present invention offers a finer lithography resolution and much more uniform lithography over entire substrate than the prior art. My results show it can achieve sub-25 nm resolution. Second, the present invention can produce sub-25 nm features in parallel over a large area, leading to a high throughput. This seems unachievable with the prior art. And thirdly, since no sophisticated energetic particle beam generator is involved, the present invention can achieve a sub-25 nm lithography over a large area at a cost much lower than the prior art. These advantages make the present invention superior to the prior art and vital to future integrated circuit manufacturing and other areas of science and engineering where nanolithography is required.

Figure 1A:
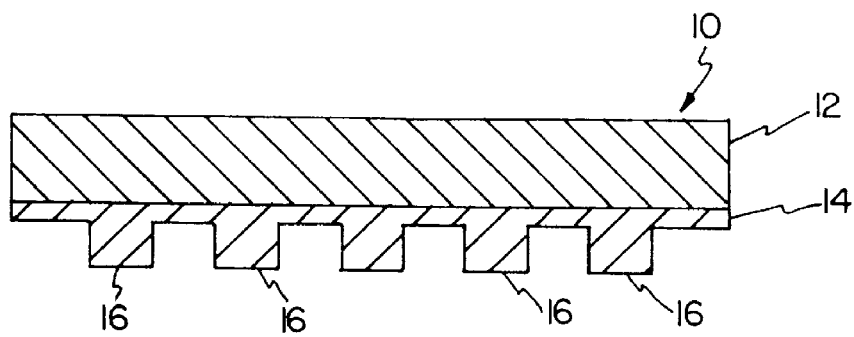
FIG. 1A is a cross sectional view showing a mold and substrate in accordance with the present invention.

FIGS. 1A–1D show steps in accordance with one embodiment. FIG. 1A shows mold 10 having body 12 and molding layer 14. Molding layer 14 is shown as including a plurality of features 16 having a desired shape. A substrate 18 carries thin film layer 20. Thin film layer 20 is deposited through any appropriate technique such as spin casting.

Figure 1B:
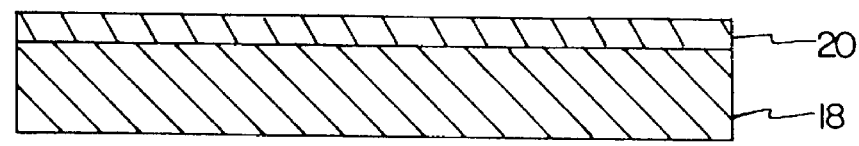
FIG. 1B is a cross sectional view of the mold and substrate of FIG. 1A showing the mold pressed into a thin film carried on the substrate.
Figure 1B:
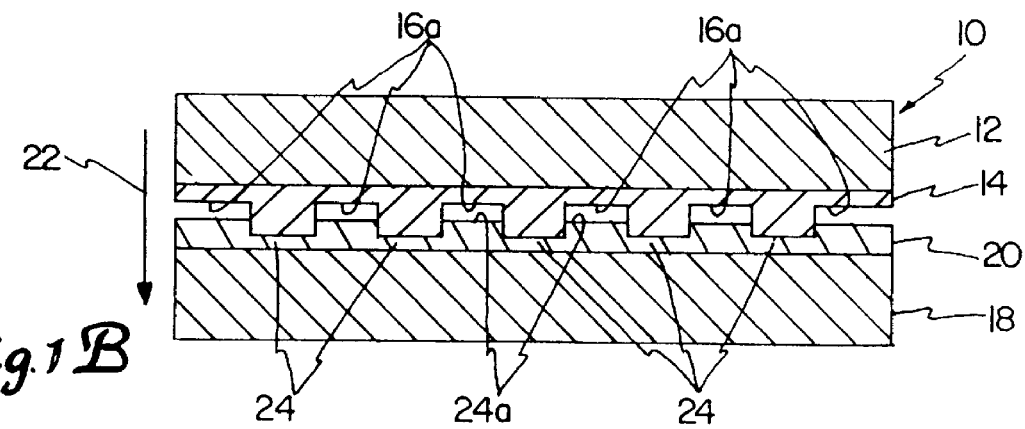

FIG. 1B shows a compressive molding step where mold 10 is pressed into thin film layer 20 in the direction shown by arrow 22 forming compressed regions 24. In the embodiment shown in FIGS. 1A–1D, features 16 are not pressed all of the way into thin film 20 and do not contact substrate 18. In some embodiments, top portions 24a of film 20 may contact depressed surfaces 16a of mold 10. This causes top surfaces 24a to substantially conform to the shape of surfaces 16a, for example flat. When contact occurs, this also can stop the mold move further into the thin film 20, due to a sudden increase of contact area and hence a decrease of the compressive pressure when the compressive force is constant.

Figure 1C:
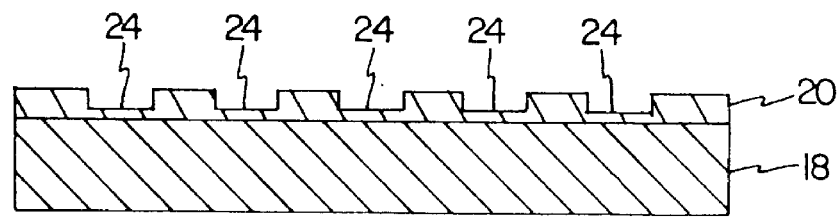
FIG. 1C is a cross sectional view of the substrate of FIG. 1B following compression of the mold into the thin film.
Figure 1D:
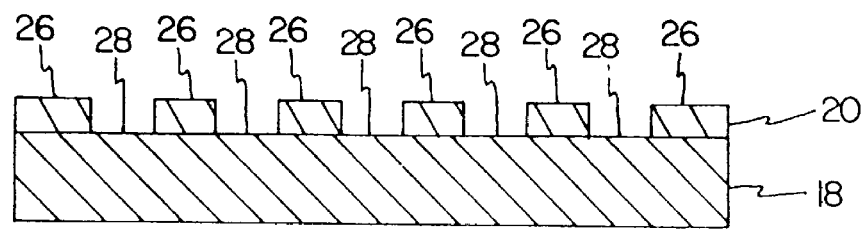
FIG. 1D is a cross sectional view of the substrate of FIG. 1C showing removal of compressed portions of the thin film to expose the underlying substrate.

FIG. 1C is a cross sectional view showing thin film layer 20 following removal of mold 10. Layer 20 includes a plurality of recesses formed at compressed regions 24 which generally conform to the shape of features 16. Layer 20 is subjected to a subsequent processing step as shown in FIG. 1D, in which the compressed portions 24 of film 20 are removed thereby exposing substrate 18. This removal may be through any appropriate process such as reactive ion etching, wet chemical etching. This forms dams 26 having recesses 28 on the surface of substrate 18. Recesses 28 form reliefs which conform generally to the shape of features 16 and mold 10.

The mold 10 is patterned with features 16 comprising pillars, holes and trenches with a minimum lateral feature size of 25 nm, using electron beam lithography, reactive ion etching (RIE) and other appropriate methods. The typical depth of feature 16 is from 5 nm to 200 nm, depending upon the desired lateral dimension. In general, the mold should be selected to be hard relative to the softened thin film, and can be made of metals, dielectrics, or semiconductors or ceramics or their combination. In one experiment, the mold 10 consists of a layer 14 and features 16 of silicon dioxide on a silicon substrate 12.

Thin film layer 20 comprises a thermoplastic polymer. During the compressive molding step shown in FIG. 1B, thin film 20 is heated at a temperature to allow sufficient softening of the film relative to the mold. For example, above the glass transition temperature the polymer has a low viscosity and can flow, thereby conforming to the features 16.

In one experiment, the thin film 20 was a PMMA spun on a silicon wafer 18. The thickness of the PMMA was chosen from 50 nm to 250 nm. PMMA was chosen for several reasons. First, PMMA does not adhere well to the $SiO_2$ mold due to its hydrophilic surface. Good mold release properties are essential for fabricating nanoscale features. Second, shrinkage of PMMA is less than 0.5% for large changes of temperature and pressure. See I. Rubin, *Injection Molding*, (Wiley, N.Y.) 1992. In a molding process, both the mold 10 and PMMA 20 were first heated to a temperature of 200° C. which is higher than the glass transition temperature of PMMA, 105° C. See M. Harmening, W. Bacher, P. Bley, A. El-Kholi, H. Kalb, B. Kowanz, W. Menz, A. Michel, and J. Mohr, Proceedings IEEE Micro Electro Mechanical Systems, 202 (1992). Then the mold 10 and features 16 were compressed against the thin film 20 and held there until the temperature dropped below the PMMA's glass transition temperature. Various pressures have been tested. It was found that the one preferred pressure is about 1900 psi. At that pressure, the pattern of the features 16 can be fully transferred into the PMMA. After removing mold 10, the PMMA in the compressed area was removed using an oxygen plasma, exposing the underlying silicon substrate and replicating the patterns of the mold over the entire thickness of the PMMA.

Figure 2:
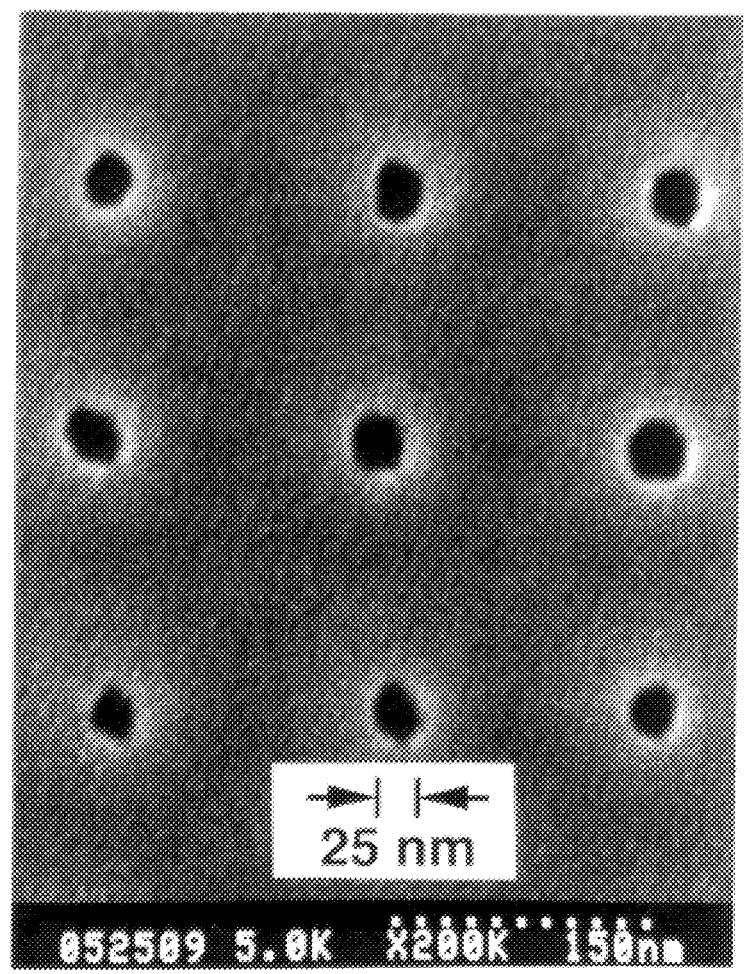
FIG. 2 is a scanning electron micrograph of a top view of 25 nm diameter holes with a 120 nm period formed by compressive molding into a PMMA film as shown in FIG. 1C.

FIG. 2 shows a scanning electron micrograph of a top view of 25 nm diameter holes with a 120 nm period formed into a PMMA film in accordance with FIG. 1C. Mold features as large as tens of microns on the same mold as the nanoscale mold features have been imprinted.

Figure 3:
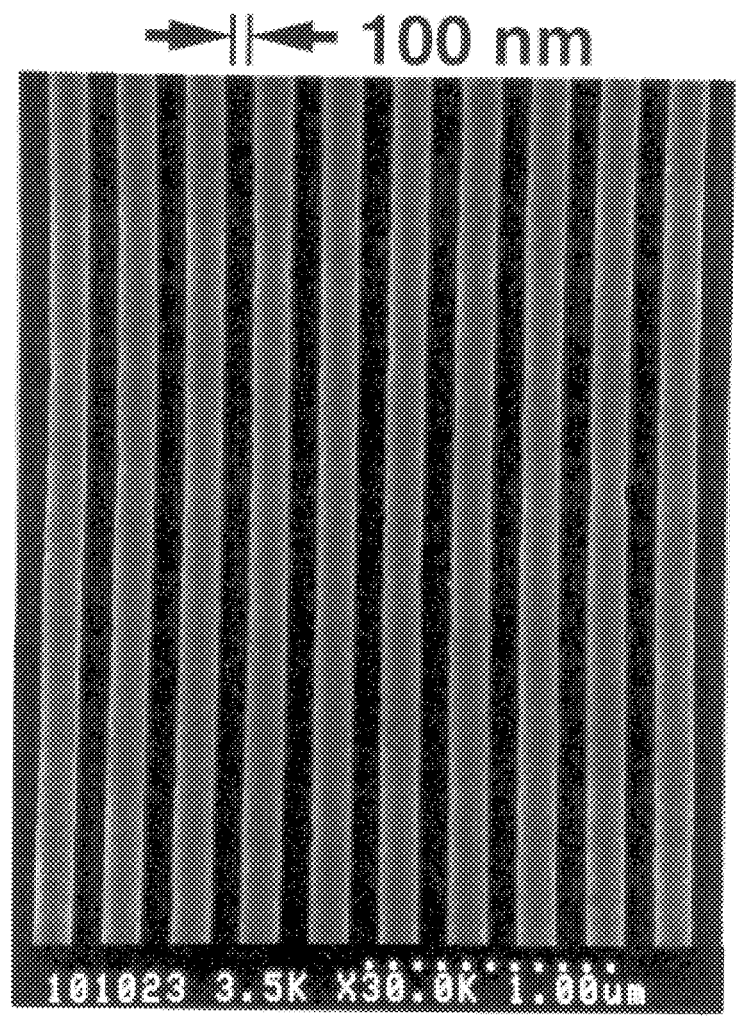
FIG. 3 is a scanning electron micrograph of a top view of a 100 nm wide trench formed by compressive molding into a PMMA film as shown in FIG. 1C.

FIG. 3 shows a scanning electron micrograph of a top view of 100 nm wide trenches with a 200 nm period formed in PMMA in accordance with FIG. 1C.

Figure 4:
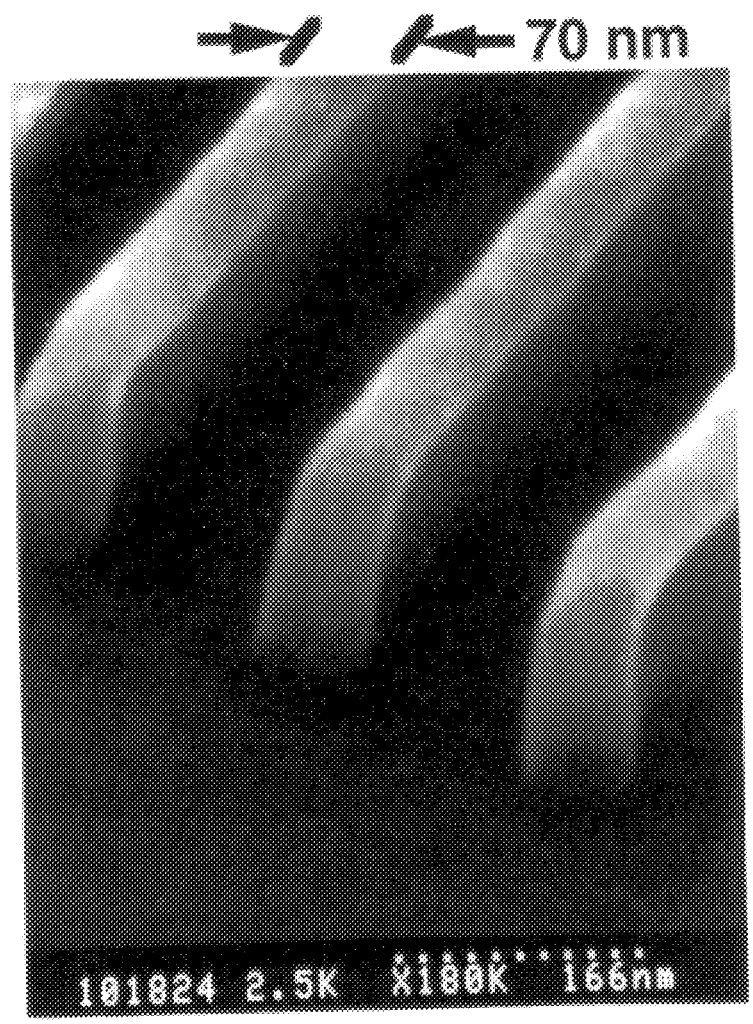
FIG. 4 is a scanning electron micrograph of a perspective view of the strips formed by compressive molding into a PMMA film as shown in FIG. 1C. The strips are 70 nm wide and 200 nm tall, and have a high aspect ratio, a surface roughness less than 3 nm, and corners of nearly a perfect 90 degrees.

FIG. 4 is a scanning electron micrograph of a perspective view of trenches made in the PMMA using the present invention with embodiment that top portions 24a of film 20 contact depressed surfaces 16a of mold 10. The strips are 70 nm wide, 200 nm tall, therefore a high aspect ratio. The surface of these PMMA features is extremely smooth and the roughness is less than 3 nm. The corners of the strips are nearly a perfect 90 degrees. Such smoothness, such sharp right angles, and such high aspect ratio at the 70 nm features size cannot be obtained with the prior art.

Furthermore, scanning electron microscopy of the PMMA patterns and the mold showed that the lateral feature size and the smoothness to the sidewalls of PMMA patterns fabricated using the present invention conform with the mold. From our observations, it is clear that the feature size achieved so far with the present invention is limited by our mold size. From the texture of the imprinted PMMA, it appears that 10 nm features can be fabricated with the present invention.

Figure 5A:
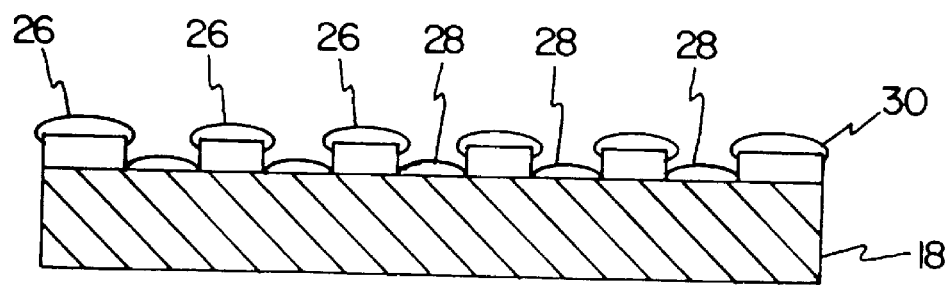
FIG. 5A is a cross sectional view of the substrate of FIG. 1D following deposition of a material.
Figure 5B:
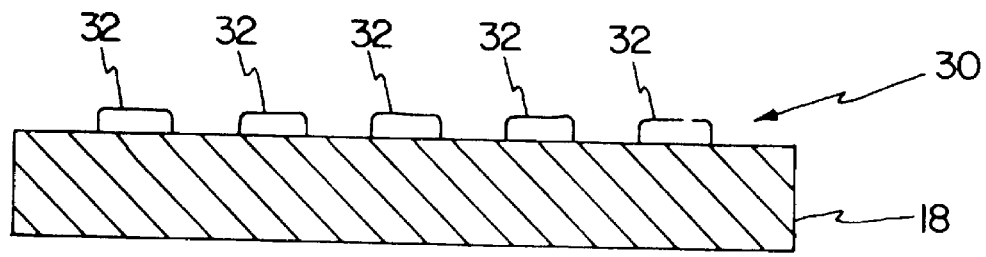
FIG. 5B is a cross sectional view of the substrate of FIG. 5A following selective removal of the material by a lift off process.

After the steps 1A–1D, the patterns in film 20 can be replicated in a material that is added on substrate 18 or can replicated directly into substrate 18. FIGS. 5A and 5B show one example of the subsequent steps which follow the steps of FIGS. 1A–1D. Following formation of the recesses 28 shown in FIG. 1D, a layer of material 30 is deposited over substrate 18 as shown in FIG. 5A. Material 30 is deposited through any desired technique over dams 26 and into recesses 28 between dams 26. Material 30 may comprise, for example, electrical conductors or semiconductors or dielectrics of the type used to fabricate integrated circuits, or it comprise ferromagnetic materials for magnetic devices. Next, a lift off process is performed in which a selective chemical etch is applied which removes dams 26 causing material 30 deposited on top of dams 26 to be removed. FIG. 5B shows the structure which results following the lift off process. A plurality of elements 32 formed of material 30 are left on the surface of substrate 18. Elements 32 are of the type used to form miniaturized devices such as integrated circuits. Subsequent processing steps similar to those shown in steps 1A–1D may be repeated to form additional layers on substrate 18.

Figure 6:
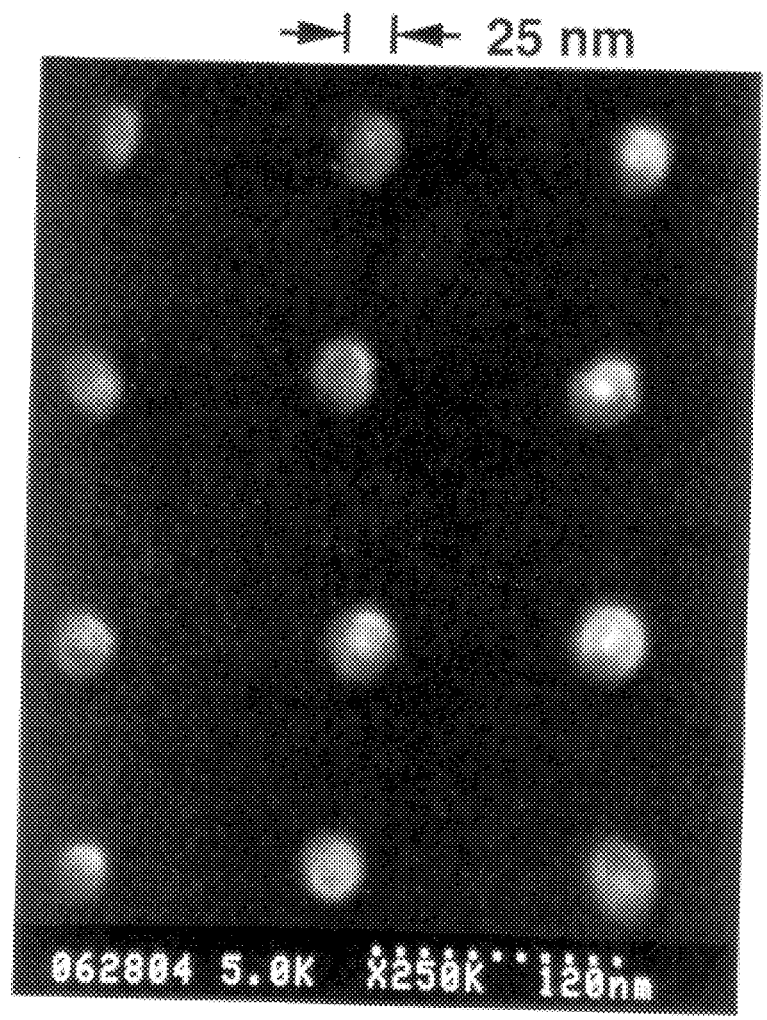
FIG. 6 is a scanning electron micrograph of the substrate of FIG. 2 following deposition of material and a lift off process. The metal dots have a 25 nm diameter that is the same as that of the holes created in the PMMA shown in FIG. 2.

FIG. 6 is a scanning electron micrograph of the substrate of FIG. 2 following deposition of 5 nm of titanium and 15 nm of gold and a lift off process. In the lift-off process, the wafers were soaked in acetone to dissolve the PMMA and therefore lift-off metals which were on the PMMA. The metal dots have a 25 nm diameter that is the same as that of the holes created in the PMMA using the present invention.

Figure 7:
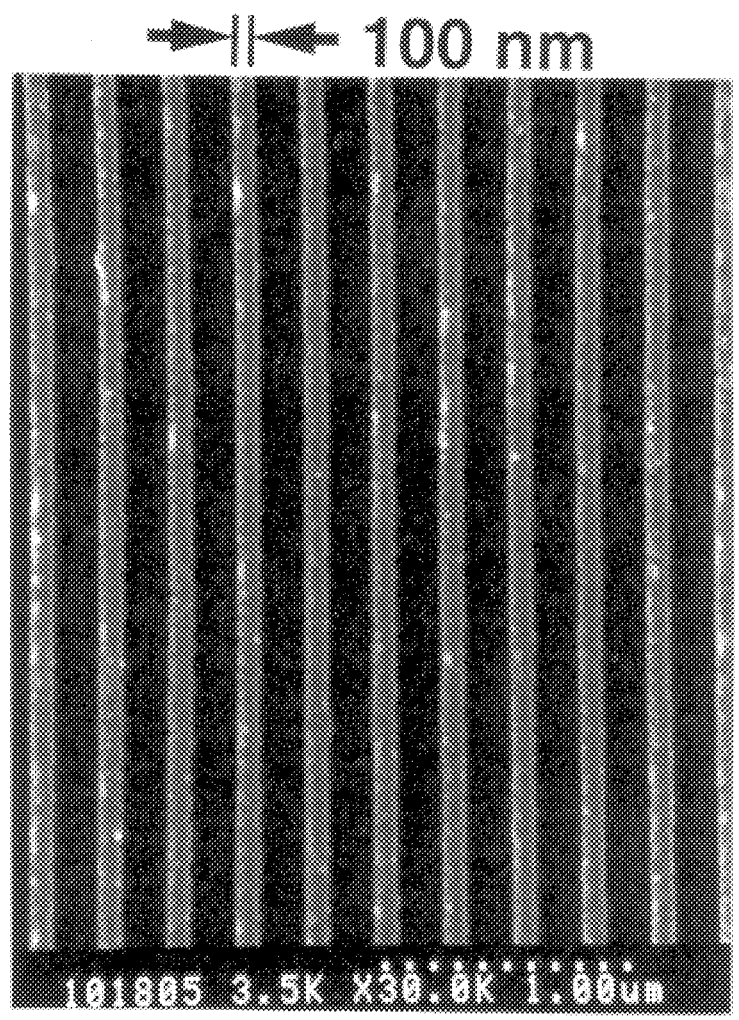
FIG. 7 is a scanning electron micrograph of the substrate of FIG. 3 following deposition of material and a lift off process. The metal linewidth is 100 nm that is the same as the width of the PMMA trenches shown in FIG. 3.

FIG. 7 is a scanning electron micrograph of the substrate of FIG. 3 following deposition of 5 nm of titanium and 15 nm of gold and a lift off process. The metal linewidth is 100 nm that is the same as the width of the PMMA trenches shown in FIG. 3. FIGS. 6 and 7 have demonstrated that, during the oxygen RIE process in the present invention, the compressed PMMA area was completely removed and the lateral size of the PMMA features has not been changed significantly.

Figure 8:
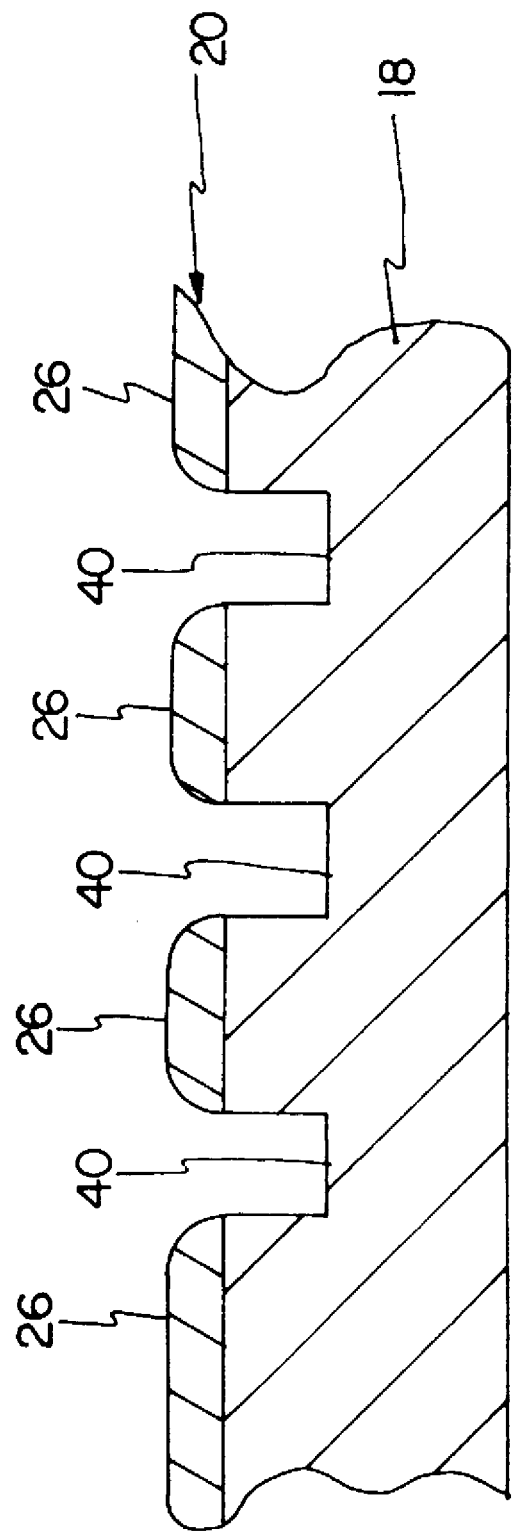
FIG. 8 is a cross sectional view of the substrate of FIG. 1D following subsequent processing.

FIG. 8 is a cross sectional view of substrate 18 of FIG. 1D following an example alternative processing step that replicates the patterns in film 20 directly into substrate 18. In FIG. 8, substrate 18 has been exposed to an etching process such as reactive ion etching, chemical etching, etc., such that recesses 40 are formed in substrate 18. These recesses 40 may be used for subsequent processing steps. For example, recesses 40 may be filled with material for use in fabricating a device. This is just one example of a subsequent processing step which can be used in conjunction with the present invention.

Molding processes typically use two plates to form malleable material therebetween. In the present invention, substrate 18 and body 12 (mold 10) act as plates for the imprint process of the invention. Substrate 18 and body 12 should be sufficiently stiff to reduce bending while forming the imprint. Such bending leads to deformation in the pattern formed in the film 20.

Figure 9:
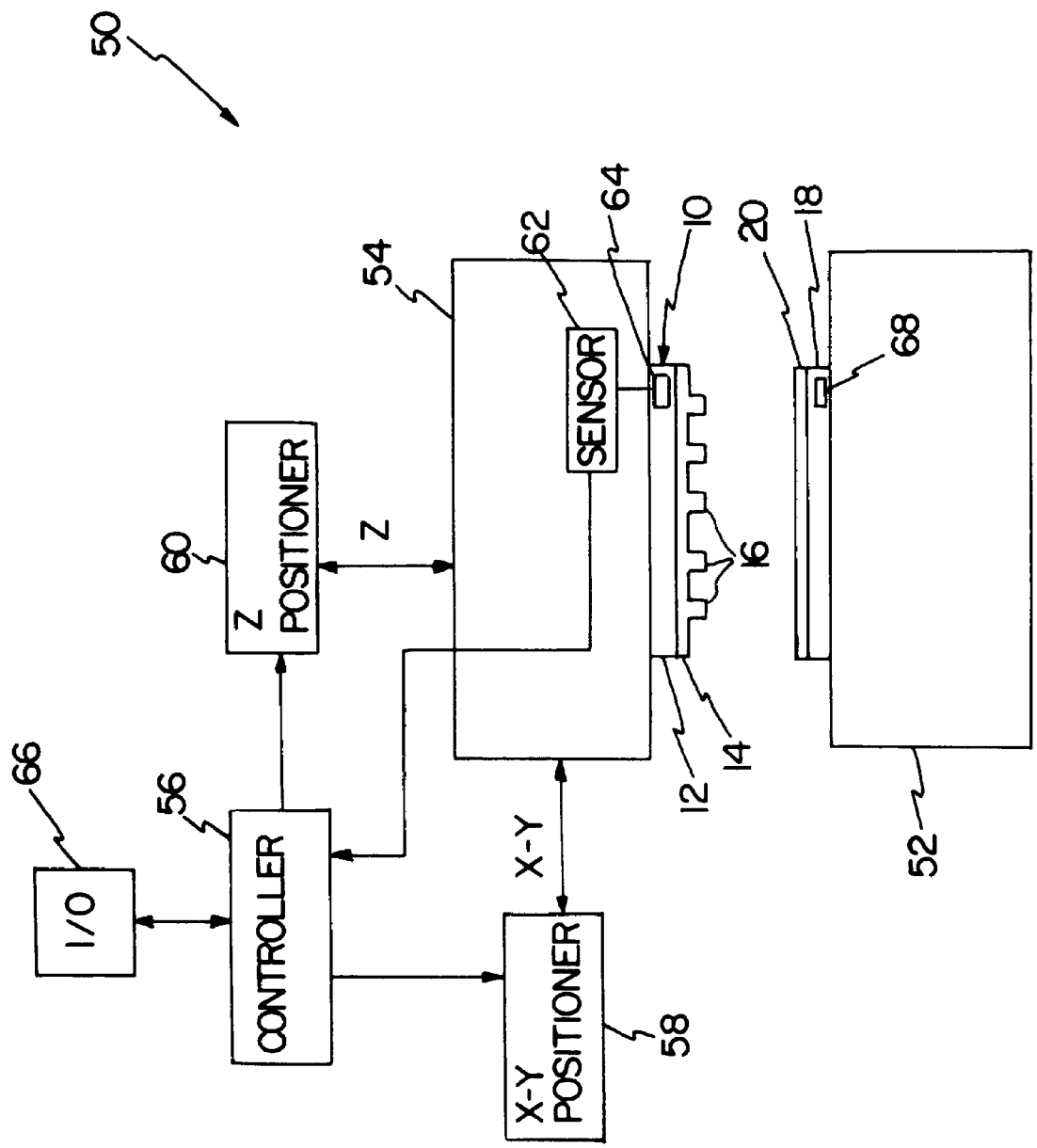
FIG. 9 is a simplified block diagram of a apparatus in accordance with one embodiment of the invention.

FIG. 9 is a simplified block diagram of apparatus 50 for performing nanoimprint lithography in accordance with the invention. Apparatus 50 includes stationary block 52 carrying substrate 18 and moveable molding block 54 carrying mold 10. Blocks 52 and 54 carry the substrate 18 and mold 10 depicted in FIGS. 1A–1D. A controller 56 couples to x-y positioner 58 and z positioner 60. An alignment mark 64 is on mold 10 and complimentary mark 68 is on substrate 18. Sensor 62 carried in block 54 couples to alignment marks 64 and 68 and provide an alignment signal to controller 56. Controller 56 is also provided with input output circuitry 66.

In operation, controller 56 controls the imprinting of mold 10 into film 20 on substrate 18 by actuating z positioner 60 which moves block 54 in the z direction relative to block 52. During the imprinting process, precise alignment of mold 10 and film 20 is crucial. This is achieved using optical or electrical alignment techniques. For example, sensor 62 and alignment marks 64 and 68 may be an optical detector and optical alignment marks which generate a moiré alignment pattern such that moiré alignment techniques may be employed to position mold 10 relative to film 20. Such techniques are described by Nomura et al. A MOIRÉ ALIGNMENT TECHNIQUE FOR MIX AND MATCH LITHOGRAPHIC SYSTEM, J. Vac. Sci. Technol. B6(1), Jan/Feb 1988, pg. 394 and by Hara et al., AN ALIGNMENT TECHNIQUE USING DEFRACTED MOIRE SIGNALS J. Vac. Sci, Technol. B7(6), Nov/Dec 1989, pg. 1977. Controller 56 processes this alignment information and adjusts the position of block 54 in the x-y plane relative to film 20 using x-y positioner 58. In another embodiment, alignment marks 64 and 68 comprise plates of a capacitor such that sensor 62 detects capacitance between marks 64 and 68. Using this technique, alignment is achieved by moving block 54 in the x-y plane to maximize the capacitance between alignment marks 64 and 68. During imprinting, controller 56 may also monitor and control the temperature of film 20.

It should be understood that the invention is not limited to the specific technique described herein, and may be implemented in any appropriate lithographic process. Generally, the mold should be hard relative to the film during the molding process. This may be achieved for example, by sufficiently heating the film. Additionally, it should be understood that the invention is not limited to the particular film described herein. For example, other types of films may be used. In one alternative embodiment, a thin film may be developed which has a chemical composition which changes under pressure. Thus, following the imprint process, a chemical etch could be applied to the film which selectively etches those portions whose composition had changed due to applied pressure. In another embodiment, after molding of the thin film to create a thickness contrast in the thin film, a material is deposited on the thin film and the thickness contrast then is transferred into the substrate.

Although the present invention has been described with reference to preferred embodiments, workers skilled in the art will recognize that changes may be made in form and detail without departing from the spirit and scope of the invention.

What is claimed is:

1. A lithographic method for forming a pattern in a film carried on a substrate, comprising the steps of:
    obtaining a substrate;
    depositing a film on the substrate;
    obtaining a mold of a stiff material which is hard relative to the film, the mold having a first protruding feature and a recess formed thereby and a second protruding feature spaced apart prom the first protruding feature, the first and second features and the recess having a shape forming a mold pattern and providing at least one mold pattern lateral dimension which is less than 200 nm;
    urging the mold at a molding pressure into the film whereby the thickness of the film under the protruding feature is reduced and a thin region is formed in the film, wherein the molding pressure is sufficiently high to transfer the mold pattern to the film and the molding pressure causes a local deformation in the mold which is less than the mold pattern lateral dimension;
    removing the mold from the film;
    processing the relief whereby the thin region is removed exposing portions of the surface of the substrate which underlie the thin region; and
    whereby the exposed portions of the surface of the substrate substantially replicate the mold pattern and have at least one lateral dimension which is less than 200 nm.

2. The method of claim 1 wherein the thin film comprises a thermoplastic polymer.

3. The method of claim 1 including heating the thin film to a temperature to allow sufficient softening of the film relative to the mold prior to the step of urging.

4. The method of claim 1 wherein the features on the mold are formed from material selected from the group consisting of: semiconductors, dielectrics, metals, and their combination.

5. The method of claim 1 wherein the step of urging comprises pressing the mold into the thin film without allowing the features to contact the underlying substrate.

6. The method of claim 1 wherein the step of processing comprises reactive ion etching.

7. The method of claim 1 including repeating the steps of obtaining a mold, urging, removing, and processing to form a multilayered device.

8. The method of claim 1 including the step of aligning the features on the mold with a pattern on the substrate.

9. The method of claim 1 including the step of depositing a material on the exposed portion of the substrate.

10. The method of claim 9 wherein the material is selected from the group consisting of: semiconductors, dielectrics, metals, and their combination.

11. The method of claim 9 including selectively removing the film following depositing the material.

12. The method of claim 11 wherein the step of selectively removing the film comprises a lift off process.

13. The method of claim 1 including removing the exposed portion of the substrate to form a recess in the substrate.

14. A lithographic method for forming a pattern in a film carried on a substrate, comprising the steps;
    obtaining a substrate;
    depositing a thin film on the substrate;
    obtaining a mold of a stiff material which is hard relative to the film, the mold having a first feature and a second feature, the first feature spaced apart from the second feature, the first and second features forming a mold pattern having at least one mold pattern lateral dimension which is less than 200 nm;
    molding the film with the features of the mold to form thin regions in the film shaped by the features by pressing the mold into the film at a molding pressure, wherein the pressure is sufficiently high to transfer the features to the film and the molding pressure causes a local deformation in the mold which is less than the mold pattern lateral dimension; and
    removing the thin region of the film exposing portions of the substrate underlying the thin regions thereby patterning the substrate with the feature to form a pattern which has at least one lateral dimension which is less than 200 nm.

15. The method of claim 14 including the step of depositing a material on the exposed portion of the substrate.

16. The method of claim 14 including removing the exposed portion of the substrate to form a recess in the substrate.

17. The method of claim 14 including repeating the steps of obtaining a mold, molding and removing to form a multilayered device.

18. The method of claim 14 including the step of aligning the features on the mold with a pattern on the substrate.

19. A lithographic method for forming a pattern in a film carried on a substrate, comprising the steps of:
    obtaining a substrate;
    depositing a film on the substrate;
    obtaining a mold of a stiff material which is hard relative to the film, the mold having a first protruding feature and a recess formed thereby, and a second protruding feature spaced apart from the first protruding feature, the features and the recess having a shape forming a mold pattern with at least one mold pattern lateral dimension which is less than 200 nm;
    urging the mold at a molding pressure into the film creating a thickness contrast pattern in the film, wherein the molding pressure is sufficiently high to transfer the features to the film and the molding pressure causes a local deformation in the mold which is less than the mold pattern lateral dimension;
    removing the mold from the film; and
    transferring the thickness contrast pattern in the film onto the substrate wherein the thickness contrast has at least one lateral dimension which is less than 200 nm.

* * * * *